United States Patent [19]

Dhillon

[11] Patent Number: 5,081,003

[45] Date of Patent: Jan. 14, 1992

[54] DEVELOPER COMPOSITIONS FOR NEWSPAPER PLATES

[75] Inventor: Major S. Dhillon, Belle Mead, N.J.

[73] Assignee: Hoechst Celanese Corporation, Somerville, N.J.

[21] Appl. No.: 433,574

[22] Filed: Nov. 7, 1989

Related U.S. Application Data

[63] Continuation of Ser. No. 317,064, Feb. 28, 1989, abandoned, which is a continuation of Ser. No. 78,125, Jul. 27, 1987, abandoned.

[51] Int. Cl.$^5$ .......................... G03C 5/24; G03C 5/30
[52] U.S. Cl. ................................. 430/309; 430/325; 430/331
[58] Field of Search ................ 430/331, 302, 309, 325

[56] References Cited

U.S. PATENT DOCUMENTS

| | | |
|---|---|---|
| 3,669,660 | 6/1972 | Golda et al. |
| 4,350,756 | 9/1982 | Burch et al. |
| 4,395,480 | 7/1983 | Sprintschnik |
| 4,436,807 | 3/1984 | Walls |
| 4,692,397 | 9/1987 | Liu ........................... 430/325 |
| 4,716,098 | 12/1987 | Mack et al. ..................... 430/331 |

FOREIGN PATENT DOCUMENTS 54-060002  5/1979  Japan.
60-097358  5/1985  Japan.

*Primary Examiner*—Hoa Van Le
*Attorney, Agent, or Firm*—Richard S. Roberts

[57] ABSTRACT

A developer composition which comprises in admixture:
- a. from about 0.1% to about 10% of sodium, potassium or lithium benzoate; and
- b. from about 0.1% to about 2.5% of sodium or potassium tetraborate; and
- c. from about 0.1% to about 10.0% of sodium or potassium citrate; and
- d. from about 0.1% to about 10.0% of sodium or potassium octyl sulfate; and
- e. from about 0.1% to about 20.0% of sodium or potassium salicylate; and
- f. from about 0.2% to about 10.0% of a solvent composition, which solvent composition consists essentially of one or more compounds selected from the group consisting of benzyl alcohol and phenoxyethanol; and
- g. an optional antifoam component in an amount of from about 0.005% to about 0.075%; and
- h. sufficient water to formulate an effective developer;

wherein said percentages are based on the weight of the developer composition.

21 Claims, No Drawings

DEVELOPER COMPOSITIONS FOR NEWSPAPER PLATES

This application is a continuation of U.S. Pat. application Ser. No. 07/317,064, filed Feb. 28, 1989, now abandoned, which was a continuation of U.S. Pat. application Ser. No. 07/078,125, filed July 27, 1987, now abandoned.

BACKGROUND OF THE INVENTION

The present invention relates to developer compositions for photographic elements comprising photosensitive coatings on substrates, or more particularly to developer compositions for removing the non-image areas of exposed, usually negative working lithographic printing plates.

In the past, various methods of developing printing plates have been employed. Such methods include the use of compositions containing organic solvents, surfactants, salts, acids and other art recognized materials in solution.

The newspaper market uses lacquers for developing wipe-on and presensitized plates. Most of the commercially available lacquers contain considerable quantities of malodorous and toxic solvents. The TLV values of these solvents are very, very low (5-25 ppm).

Most lacquer developers used in the newspaper market to develop wipe-on or pre-sensitized plates contain cyclohexanone, cyclohexanol, DMF, glycol ethers and acetic acid. All these chemicals are highly toxic and hazardous in nature and have objectionable odors. This invention replaces these chemicals with less hazardous chemicals for processing newsplate.

The advantages of an aqueous developer are:
1. no objectionable odor
2. safer working environment
3. fewer problems with disposal of the spent developer.

As a prerequisite for any newsplate developer, it must be able to be used in existing lacquer type developing machinery.

It is most desirable to have a developer composition which is capable of completing development in a short period of time. The oleophilic image areas of the printing plate should be ink receptive and water repellant whereas the hydrophilic non-image areas should be water receptive and greasy ink repellant.

The proper selection of the solvent in a developer solution is very important. If the selected solvent in a developer solution is a good solvent for the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly in negative working plates, non-image areas comprising resin binders such as acetals, and particularly polyvinyl formal, solvate in the developer solution and separate from the support and contract to spherical shapes in a highly tacky condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet.

To provide a partial solution to the problem, volatile solvents are used in many prior art developer compositions. It is expected that the use of such volatile solvents in the developer solution will prevent tackiness in the image by permitting rapid evaporation. However, use of large amounts of water miscible low boiling point solvents for example, as used in the developer described in U.S. Pat. No. 3,954,472, produces the problems of working sanitation, hazards due to low flash point and pollution. A reduction of the concentration of these water miscible low boiling point solvents helps to minimize these problems in the working environment, however, the speed of development will be adversely affected. Also the tackiness of the coatings is reduced but not completely eliminated.

To improve the speed of development of developer solutions containing a lower concentration of low boiling points solvents, an adjuvant organic solvent is sometime added. Unfortunately, such developers suffer from several drawbacks including: toxicity, developer instability, odor or inability to effectively clean out unwanted background non-image areas.

Lithographic printing plates generally are composed of an aluminum containing substrate which may or may not have been treated with a variety processes recognized in the art process including anodization, graining and hydrophilization. The thusly prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419.

Typical prior art developing compositions are described in U.S. Pat No. 2,754,279; 4,381,340 and German OLS 2,216,419.

SUMMARY OF THE INVENTION

The invention provides a developer composition which comprises in admixture:
a. from about 0.1% to about 10.0% of sodium, potassium or lithium benzoate; and
b. from about 0.1% to about 2.5% of sodium or potassium tetraborate; and
c. from about 0.1% to about 10.0% of sodium or potassium citrate; and
d. from about 0.1% to about 10.0% of sodium or potassium octyl sulfate; and
e. from about 0.1% to about 20.0% of sodium or potassium salicylate; and
f. from about 0.2% to about 10.0% of a solvent composition, which solvent composition consists essentially of one or more compounds selected from the group consisting of benzyl alcohol and phenoxyethanol; and
g. an optional antifoam component in an amount of from about 0.005% to about 0.075%; and
h. sufficient water to formulate an effective developer; wherein said percentages are based on the weight of the developer composition.

The invention further provides a method for preparing a photographic element which comprises imagewise exposing a photographic element comprising a light sensitive negative working or positive working photographic composition disposed on a substrate with sufficient actinic radiation to form a latent image and then removing the non-image areas of said exposed element with a developer composition which comprises in admixture:

a. from about 0.1% to about 10.0% of sodium, potassium or lithium benzoate; and
b. from about 0.1% to about 2.5% of sodium or potassium tetraborate; and
c. from about 0.1% to about 10.0% of sodium or potassium citrate; and
d. from about 0.1% to about 10.0% of sodium or potassium octyl sulfate; and
e. from about 0.1% to about 20.0% of sodium or potassium salicylate; and
f. from about 0.2% to about 10.0% of a solvent composition, which solvent composition consists essentially of one or more compounds selected from the group consisting of benzyl alcohol and phenoxyethanol; and
g. an optional antifoam component in an amount of from about 0.005% to about 0.075%, and
h. sufficient water to formulate an effective developer; wherein said percentages are based on the weight of the developer composition.

DETAILED DESCRIPTION OF THE PREFERRED EMBODIMENT

As the first step in the production of negative working photographic elements such as lithographic printing plates, a sheet substrate such as aluminum compositions suitable for the manufacture of lithographic printing plates such as, Alcoa 3303 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with a light sensitive polymeric diazonium salt or photopolymer containing composition. Such compositions may also contain binding resins, such as polyvinyl formal resins, colorants, acid stabilizers, surfactants, exposure indicators or other art recognized ingredients.

The photosensitive sheet material is then exposed to a suitable radiation source through a mask or transparency, and the exposed sheet then developed for removal of the non-image photosensitive materials.

The photosensitive coating mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2^+X$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid condensation of certain aromatic carbonyl compounds such as formaldehyde, as disclosed for example in U.S. Pat. Nos. 2,063,631 and 2,667,415. A preferred class of diazonium compounds is described in U.S. Pat. No. 3,849,392. All of the foregoing patents are incorporated herein by reference.

A most preferred diazonium salt is the polycondensation product of 3-methoxy-4-diazo-diphenyl amine sulfate and 4,4'-bis-methoxy methyl-diphenyl ether, precipitated as the mesitylene sulfonate, as taught in U.S. Pat. No. 3,849,392.

Suitable photopolymerizable compositions are also well known to the skilled artisan.

The present invention provides a method for developing such exposed photosensitive elements by contacting them, to remove the non-image areas, using a developer which contains the aforementioned ingredients in an aqueous mixture.

The developer contains a sodium potassium or lithium benzoate component. In the preferred embodiment this component is present in an amount of from about 0.1% to about 10.0% by weight of the developer. A more preferred range is from about 0.5% to about 2.5% and most preferably from about 1.0% to about 1.5%.

The developer also contains from about 0.1% to about 2.5% by weight of the developer of sodium or potassium tetraborate. A more preferred range is from about 0.2% to about 1.0% and most preferably from about 0.4% to about 0.7%.

The developer further contains from about 0.1% to about 10% by weight of the developer of sodium or potassium citrate. A more preferred range is from about 1.0% to about 4.0% and most preferably from about 1.5% to about 2.5%.

The developer also contains from about 0.1% to about 10.0% based on the weight of the developer of sodium or potassium octyl sulfate. A more preferred range is from about 0.5% to about 2.0% and most preferably from about 0.7% to about 1.2%.

The developer contains 0.1% to about 20.0% based on the weight of the developer of sodium or potassium salicylate. A more preferred range is from about 5.0% to about 10.0% and most preferably from about 7.5% to about 8.5%.

The developer contains from about 0.2% to about 10.0% based on the weight of the developer of benzyl alcohol or phenoxyethanol. A more preferred range is from about 0.5% to about 5.0% and most preferably from about 1.0% to about 3.0%. In the preferred embodiment, the developer contains no other organic solvents and the balance of the developer comprises sufficient water to formulate an effective developer.

In the preferred embodiment, the developer of the present invention preferably contains optional minor amounts of a conventional antifoam component which aids in processing of the printing plate. This component, when it is used is preferably present in an amount of from about 0.005% to about 0.075% by weight of the developer. A more preferred range is from about 0.10% to about 0.05% and most preferably from about 0.02% to about 0.04%.

One preferred antifoam agent is Dow DB-100 which is a silicone type antifoam. The developer may also contain optional film formers. The developer is capable of substantially completely removing the non-image areas of a photographic element in about 2 minutes or less while simultaneously removing substantially none of the image areas. Substantially none of the material comprising said non-image areas is re-deposited back onto said photographic element.

The following non-limiting examples serve to illustrate the invention.

EXAMPLE I

ENCO® presensitized C-150/Newsplate A plates, commercially available from Hoechst Celanese Corporation of Somerville, N.J. are imagewise exposed to 230MJ/cm² and developed with the following developer.

| Ingredients | Weight Percent |
|---|---|
| Water | 84.470 |
| Sodium benzoate | 1.325 |
| Potassium tetraborate | 0.530 |
| Sodium citrate | 2.607 |
| Sodium octyl sulfate | 1.060 |
| Sodium salicylate | 7.950 |
| Phenoxyethanol | 0.530 |
| Benzyl alcohol | 1.500 |
| Antifoam DB-100 | 0.028 |

Exposed plates are passed through a National Processor at a plate throughput speed of 3, 4 and 5 feet per minute. The developer flow is set at 6. ENCO subtractive finisher is used to finish the plates. The plates are put on the press for a roll-up test and length of run test under abrasive conditions. The plate runs 110 M impressions and gives acceptable roll-up at 15 sheets with resolution 8–10 U (UGRA) and 1–98% dots on a 150 lines per inch screen.

The following developer compositions are formulated:

Example II

| Ingredients | Weight Percent |
|---|---|
| Water | 84.173 |
| Lithium benzoate | 1.105 |
| Potassium tetraborate | 0.530 |
| Sodium citrate | 1.607 |
| Sodium octyl sulfate | 2.607 |
| Sodium salicylate | 8.950 |
| Benzyl alcohol | 1.000 |
| Antifoam DB-100 | 0.028 |

EXAMPLE III

| Ingredients | Weight Percent |
|---|---|
| Water | 82.030 |
| Lithium benzoate | 1.795 |
| Potassium tetraborate | 1.530 |
| Sodium citrate | 1.607 |
| Sodium xylene sulfonate | 1.060 |
| Sodium salicylate | 9.450 |
| Benzyl alcohol | 2.500 |
| Antifoam DB-100 | 0.028 |

EXAMPLE IV

| Ingredients | Weight Percent |
|---|---|
| Water | 84.470 |
| Sodium benzoate | 1.325 |
| Potassium tetraborate | 0.530 |
| Sodium citrate | 2.607 |
| Sodium octyl sulfate | 1.060 |
| Sodium salicylate | 7.950 |
| Phenoxy propanol | 2.030 |
| Antifoam DB-100 | 0.028 |

EXAMPLE V

| Ingredients | Weight Percent |
|---|---|
| Water | 83.030 |
| Lithium benzoate | 1.795 |
| Sodium citrate | 1.607 |
| Potassium tetraborate | 1.530 |
| Sodium xylene sulfonate | 2.060 |
| Sodium salicylate | 8.450 |
| Benzyl alcohol | 1.500 |
| Antifoam DB-100 | 0.028 |

EXAMPLE VI

| Ingredients | Weight Percent |
|---|---|
| Water | 84.470 |
| Sodium benzoate | 1.325 |
| Potassium tetraborate | 0.530 |
| Sodium citrate | 2.607 |
| Sodium octyl sulfate | 1.060 |
| Sodium salicylate | 7.950 |
| Benzyl alcohol | 2.030 |
| Antifoam DB-100 | 0.028 |

The developers of Examples II–IV are tested on presensitized C-150 plates by the procedure illustrated in Example 1. The developers in Example II–IV give acceptable development of plates with substantially the same functional properties.

What is claimed is:

1. A developer composition which consists essentially of in admixture.
    a. from about 0.1% to about 10.0% of sodium, potassium or lithium benzoate; and
    b. from about 0.1% to about 2.5% of sodium or potassium tetraborate; and
    c. from about 0.1% to about 10.0% of sodium or potassium citrate; and
    d. from about 0.1% to about 10.0% of sodium or potassium octyl sulfate; and
    e. from about 0.1% to about 20.0% of sodium or potassium salicylate; and
    f. from about 1.0% to about 5.0% of a solvent composition, which solvent composition consists essentially of benzyl alcohol; and
    g. an optional antifoam component in an amount of from about 0.005% to about 0.075%, and
    h. sufficient water to formulate an effective developer;

wherein said percentages are based on the weight of the developer composition.

2. The developer of claim 1 wherein component (a) comprises sodium benzoate.

3. The developer of claim 1 wherein component (b) comprises potassium tetraborate.

4. The developer of claim 1 wherein component (c) comprises sodium citrate.

5. The developer of claim 1 wherein component (d) comprises sodium octyl sulfate.

6. The developer of claim 1 wherein said component (e) comprises sodium salicylate.

7. The developer of claim 1 wherein component (a) is present in an amount of from about 0.5% to about 2.5% based on the weight of the developer composition.

8. The developer of claim 1 wherein component (b) is present in an amount of from about 0.2% to about 1.0% based on the weight of the developer composition.

9. The developer of claim 1 wherein component (c) is present in an amount of from about 1.0% to about 4.0% based on the weight of the developer composition.

10. The developer of claim 1 wherein said component (d) is present in an amount of from about 0.5% to about 2.0% based on the weight of the developer composition.

11. The developer of claim 1 wherein component (e) is present in an amount of from about 5.0% to about 10.0% based on the weight of the developer composition.

12. The developer of claim 1 wherein component (f) is present in an amount of from about 1.0% to about 3.0% based on the weight of the developer composition.

13. The developer of claim 1 wherein said component (a) comprises sodium benzoate and is present in an amount of from 1.0% to about 1.5% component (b) comprises potassium tetraborate and is present in an amount of from about 0.4% to about 0.7%, component (c) comprises potassium citrate and is present in an amount of from about 1.5% to about 2.5%, component (d) comprises sodium octyl sulfate and is present in an amount of from about 0.7% to about 1.2%, component (e) comprises sodium salicylate and is present in an amount of from about 7.% to about 8.5% and said component (f) is benzyl alcohol and is present in an amount of from about 1.0% to about 3.0%, and said component (g) is an amount of from about 0.02% to about 0.04%.

14. A method of developing a photographic element for use in a newspaper printing plate which comprises imagewise exposing negative working photographic element to sufficient actinic radiation to form a latent image thereon, and then removing the non-image portions thereof with:

a developer composition which consists essentially of in admixture:
 a. from about 0.1% to about 10.0% of sodium, potassium or lithium benzoate; and
 b. from about 0.1% to about 2.5% of sodium or potassium tetraborate; and
 c. from about 0.1% to about 10.0% of sodium or potassium citrate; and
 d. from about 0.1% to about 10.0% of sodium or potassium octyl sulfate; and
 e. from about 0.1% to about 20.0% of sodium or potassium salicylate; and
 f. from about 1.0% to about 5.0% of a solvent composition, which solvent composition consists essentially of benzyl alcohol; and
 g. an optional antifoam component in an amount of from about 0.005% to about 0.075%, and
 h. sufficient water to formulate an effective developer;
wherein said percentages are based on the weight of the developer composition.

15. The method of claim 14 wherein component (a) comprises sodium benzoate.

16. The method of claim 14 wherein component (b) comprises potassium tetraborate.

17. The method of claim 14 wherein component (c) comprises sodium citrate.

18. The method of claim 14 wherein component (d) comprises sodium otcyl sulfate.

19. The method of claim 14 wherein said component (e) comprises sodium salicylate.

20. The method of claim 14 wherein said component (a) is present in an amount of from about 0.5% to about 2.5%, component (b) is present in an amount of from about 0.2% to about 1.0%, component (c) is present in an amount of from about 1.0% to about 4.0%, component (d) is present in an amount of from about 0.5% to about 2.0%, component (e) is present in an amount of from about 5.0% to about 10.0% and component (f) is present in an amount of from about 1.0% to about 3.0%, where said percentages are based on the weight of the developer.

21. The method of claim 14 wherein said component (a) comprises sodium benzoate and is present in an amount of from about 1.0% to about 1.5%, component (b) comprises potassium tetraborate and is present in an amount of from about 0.4% to about 0.7%, component (c) comprises sodium citrate and is present in an amount of from about 1.5% to about 2.5%, component (d) comprises sodium octyl sulfate and is present in an amount of from about 0.5% to about 2.0%, component (e) is present in an amount of from about 5.0% to about 10.0% and component (f) is present in an amount of from about 1.0% to about 3.0%, wherein said percentages are based on the weight of the developer.

* * * * *